HYBRID ANALOG TO DIGITAL CONVERTER
Filed Dec. 23, 1964
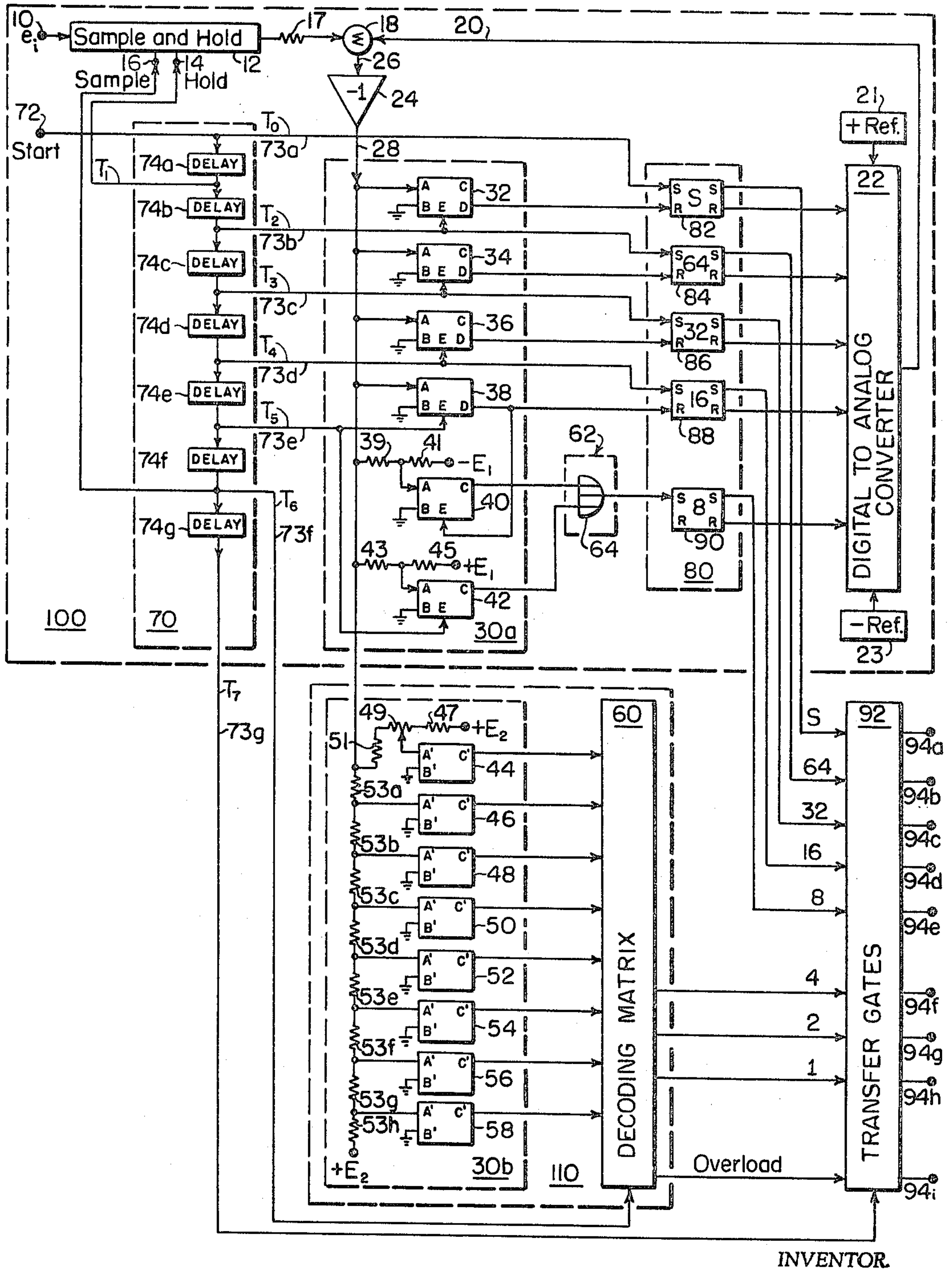
INVENTOR.
PAUL G. LUCAS
BY Kenway Jenney & Hildreth
ATTORNEYS United States Patent Office 3,384,889
Patented May 21, 1968

3,384,889

HYBRID ANALOG TO DIGITAL CONVERTER

Paul G. Lucas, Magnolia, Mass., assignor to Adage, Inc., Cambridge, Mass., a corporation of Massachusetts Filed Dec. 23, 1964, Ser. No. 420,538
7 Claims. (340—347)

ABSTRACT OF THE DISCLOSURE

A high speed bi-polar analog to digital converter for converting an analog signal to binary form which utilizes the combination of a sequential feedback converter for the higher order digits and a simultaneous converter using parallel threshold decoding for the lower order digits. The output signal from the summing junction of the sequential feedback converter is supplied as the input signal to the simultaneous converter and the complete output signal is made available only after the sequential feedback converter has completed a complete conversion. A complete conversion of an analog signal into eight binary bits has been completed in one microsecond in one embodiment of an analog to digital converter incorporating the invention.

My invention relates to high speed analog to digital converters. In particular, my invention relates to high speed analog to digital converters of the feedback type.

Analog to digital converters of the feedback type are known devices. In general, in converters of this type, the analog input signal is applied via a summing junction to a comparator circuit. The output signal from the comparator circuit, which provides an indication of the polarity of the input signal applied thereto, is used to vary the count in a counter which is capable of assuming one or more states for each digit to be represented. The count in the counter circuit is applied to a digital to analog converter which converts the instantaneous value of the digital number stored in the counter circuit into an analog signal proportional to this digital number and supplies this signal to the summing junction where it is subtracted from the analog input signal to form an error signal for the comparator. The digital number stored in the counter circuit is thus varied in accordance with the output of the comparator circuit until the analog signal fed back to the summing junction by the digital to analog converter is equal to the analog input signal; at this point the error signal applied to the comparator from the summing junction is equal to zero and the conversion of the analog input signal into digital form has been completed. A fuller description of an analog to digital converter of the feedback type is contained in U.S. Patent No. 3,052,880, issued Sept. 4, 1962, to F. M. Young et al. and which is assigned to the assignee of the present invention.

Converters of the feedback type are capable of performing highly accurate conversions but suffer several disadvantages, among the most important of which are speed limitations on the conversion process. In prior art converters, it was a general practice to utilize a single comparator circuit to control the digital counters, the output signal from the comparator being switched to the appropriate input terminal of the counter by means of logical control circuitry. The rate at which new conversions could be made was, therefore, controlled by the settling time of the comparator circuit, the comparator requiring a discrete time interval in which to "recover" from the prior comparison before a new comparison could be made. Various attempts to overcome the disadvantages of using a single comparator have resulted in analog to digital converters with improved speed capabilities but with attendant disadvantages which often outweigh the value of the increased speed so obtained. One such attempt involves the use of a "parallel threshold decoder" in which a multiplicity of comparators are used to determine all bits of an N-bit digital number simultaneously. This technique, while extremely fast, involves a considerable increase in the number of comparator units required for conversion of the analog signal. Thus, for example, for the conversion of an N-bit number, $2^N-1$ comparator circuits are required if the method of parallel threshold decoding is utilized. This increase in the number of comparator circuits required thus offsets the increased speed which is obtained with this method.

To overcome these and other disadvantages of prior art converters, I provide an analog to digital converter which operates as a feedback converter during the time interval in which the high order bits are being converted and which operates as a parallel threshold decoder during the time in which the low order bits are being determined. Certain of the high order bits are themselves determined by a method which is related to the parallel threshold decoding method and which is incorporated in a structure that is compatible with the feedback type of conversion method. The highest order bits utilize a single comparator for each bit which is to be determined, the comparator being used to set a control flip-flop to the appropriate state whereby predetermined amounts of currents may be supplied to or subtracted from the summing junction by means of the digital to analog converter in accordance with the setting of the control flip-flops. A simultaneous conversion of the remaining high order bits is then performed and the result of this conversion is used to set two or more flip-flops to the appropriate states for controlling the digital to analog converter. A pure parallel threshold decoding scheme is used for the determination of the lowest order bits and control flip-flops are accordingly not required for these bits. Since my converter possesses characteristics of both the feedback type and the parallel threshold decoding type, it will be referred to hereinafter as a hybrid converter.

Accordingly, it is an object of my invention to provide an improved analog to digital converter which is capable of attaining high speeds with only a relatively slight increase in the complexity of the circuitry required. Further, it is an object of my invention to provide an improved analog to digital converter of the feedback type having a single comparator unit for the higher order bits of the digital number to be represented.

Still a further object of my invention is to provide an analog to digital converter of the hybrid type in which a simultaneous conversion of at least some of the high-order bits is performed within a feedback loop including these bits. Another object of my invention is to provide a hybrid analog to digital converter which combines the advantages of both the feedback type and the simultaneous determination type of converters. Yet another object of my invention is to provide an improved comparator circuit for the simultaneous determination of each pair of bits of an N-bit digital number. Other and further objects of my invention will become apparent by reference to the following detailed description taken in conjunction with the single figure of my invention, the single figure being a block and line diagram of an analog to digital converter incorporating my invention.

*1.—General description*

As shown in the single figure, an input terminal 10 is connected to a Sample and Hold circuit 12 having terminals 14 and 16. The output signal from the Sample and Hold circuit is applied to the summing junction 18 via the resistor 17 where it is combined with the analog feedback signal appearing on lead 20 from the digital to analog converter 22. The difference between the signal applied through the resistor 17 and that supplied on lead 20 is applied to the inverting amplifier 24 via lead 26 and thence via lead 28 to the comparator circuits generally indicated at 30*a* and 30*b*. Although the amplifier 24 has been shown as having a gain of −1, it will be apparent that other values of gain may be used if desired.

The comparator units 30*a* and 30*b* contain three groups of comparators, the first group comprising comparators, 32, 34, 36, the second comprising comparators 38, 40, and 42, and the third group comprising comparators 44, 46, 48, 50, 52, 54, 56, and 58. The comparators 32–42 have input terminals A and B and output terminals C and D. Input terminal B is connected to a reference potential; in FIGURE 1 the reference potential is shown as being at ground. The error signal from the amplifier 24 is applied directly to terminal A of the comparators 32–38 and is applied to terminal A of the comparators 40 and 42 by means of the voltage dividers 39, 41 and 43, 45 respectively. A reference potential $+E_1$ is applied to the resistor 41 and a reference potential $-E_1$ is applied to the resistor 45; the purpose of this will be explained subsequently. The comparators 44–58 have input terminals A′ and B′ and an output terminal C′. The output signal from the comparators 32–42 is a voltage pulse while the output signal from the comparators 44–58, is a voltage level. The comparators 32–42 may utilize any of a number of well known comparator circuits which provide a pulse on one of two output leads dependent on the polarity of the input signal supplied thereto. Similarly, the comparators 44–58 may use any of a number of well known comparators or may utilize the novel comparator circuit disclosed in my copending application Ser. No. 424,167 filed of even date with this application. The comparators 32–42 will supply an output pulse on terminal C if the input signal applied to terminal A is less than the reference signal applied to terminal B and will supply an output signal on the output terminal D if the input signal on terminal A is greater than the reference signal applied to terminal B. In similar fashion, the comparators 44 through 58 will supply an output level on the output terminal C′ if the signal applied to the input terminal A′ is less than the reference signal applied to the input terminal B′.

The output signals from the comparators 32–38 are applied to the reset terminals R of the control flip-flops 82–88 respectively while the output signal from the comparators 40 and 42 is applied to the set terminal S of the flip-flop 90 through the decoding matrix 62 consisting of the OR gate 64; the timing pulses $T_0$, $T_2$, $T_3$, and $T_4$ are applied to the set terminals S of the control flip-flops 82–88 respectively. The flip-flops 82–90 control the operation of the digital to analog converter 22 which has the reference voltages 21 and 23 applied thereto; the converter 22 supplies fixed amounts of positive and negative current to the summing junction 18 via the lead 20 in accordance with the setting of the flip-flops 82–90 of the control flip-flop register 80. The converter 22 may consist of a number of well known converter units and accordingly it will not be further described in detail.

The signal from the inverting amplifier 24 is applied to the comparators 44–58 by means of the translating resistors 53*a*–53*h*. These resistors translate the input signal to the comparators by increasing amounts, thereby dividing the signal appearing on the lead 28 into a series of discrete voltage levels to achieve quantization of the error signal to the nearest of these levels. A voltage $E_2$ is applied to the lower end of the resistor 53*h* to translate the input signals to the comparators upwards. A voltage divider network consisting of the resistors 47 and 51 and the potentiometer 49 is connected to the input terminal A′ of the comparator 44; this comparator tests the error signal for overload voltages and provides an appropriate indication as an output signal from the decoding matrix 60.

The clock pulse generator 70 has an input terminal 72 to which an appropriate start signal is applied and a delay line consisting of the individual delay units 74*a*–74*f* through which the start pulse is propagated with increasing delay intervals in order to provide the timing pulses $T_0$–$T_7$ on the timing pulse leads 73*a*–73*g* respectively. These timing pulses are supplied to the set terminal S of the flip-flops 82–88 in the control flip-flop circuit 80, to the terminal E of the comparators 32–38 and 42, to the decoding matrix 60, the transfer gates 92, and the terminals 14 and 16 of the Sample and Hold circuit 12. The delay unit 74 may be formed from any of the well known delay unit systems. An example of a simple delay line suitable for use with my circuit is shown at p. 501 of "Digital Computer and Control Engineering" by R. S. Ledley.

It will be observed that the analog to digital converter, shown in the drawing may be viewed as being composed of two sections, the first section, shown generally at 100, comprising a converter of the feedback type and the second section, shown generally at 110, comprising a converter of the parallel converter type. This will be explained in more detail below.

2.—*Operation*

The operation of the circuit is as follows. The analog to digital converter is a bipolar converter that is, converts both positive and negative input signals; accordingly the sign of the input signal is first determined. If the input signal applied to the input terminal 10 is of positive polarity, the sign control flip-flop 82 is set for positive input signals and the determination of the high-order bits of the digital equivalent of the analog input signal commences; if, on the other hand, the input signal is of negative polarity, the sign control flip-flop 82 is set for negative input signals. The digital to analog converter 22 then supplies a positive full-scale current to the summing junction 18 where it is added to the analog input signal to converter the signal to an equivalent positive input signal before conversion of the high-order bits commences.

The first three bits of the digital signal (the sign bit plus bits 64 and 32) are determined one bit at a time by the comparators 32–36 and the control flip-flops 82–86 which form a sequential converter; the next two bits are determined simultaneously by the comparators 38–42 forming a simultaneous converter. The last three bits of the digital signal are converted simultaneously by the comparators 44–58 which form a simultaneous converter. This will be more readily understood from the following detailed description taken in connection with the single figure of the drawing.

At the time $T_0$, a Start pulse is applied to the terminal 72 of the delay unit 70. This pulse is supplied via the lead 73*a* to the set terminal S of the control flip-flop 82, thereby setting the flip-flop 82 to its set condition in which the set output terminal is at a voltage level that is positive with respect to the Reset output terminal voltage level. The timing pulse supplied on the leads 73*a* may also be gated to the Reset input terminals R of the control flip-flops 84, 86, 88, and 90 as well as to the decoding matrix 60 to clear the flip-flops and matrix for a new conversion of the input signal; for the sake of clarity in FIGURE 1, this additional gating circuitry is not shown.

The Start pulse is also propagated down the delay line 70, and at the time $T_1$ a timing pulse is supplied to the terminal 14 of the Sample and Hold circuit 12 to select a value of the input signal for measurement; this signal is applied by a resistor 17 to the summing junction 18 and thence by the lead 26 to the inverter amplifier 24. If the input signal is positive at this time, the output signal appearing on the lead 28 and supplied to the comparator 32 will be of negative polarity. Accordingly, when the comparator 32 is interrogated at time $T_2$, the input signal applied to the terminal A will be more negative than the reference signal applied to the terminal B and no output pulse will appear on the output terminal D. Accordingly, the control flip-flop 82 will remain in the set condition, thus indicating that the input signal is positive. If, on the other hand, the input signal is negative, the error signal appearing on the lead 28 when the comparator 32 is interrogated at the time $T_2$ will be positive thus causing an output pulse to appear on the terminal D of the comparator 32. This output pulse will be applied to the Reset terminal of the flip-flop 82 to reverse the state of the flip-flop and cause the digital to analog converter 22 to supply a full scale current to the summing junction 18. This full scale current is of such polarity that it is added to the input signal at the summing junction to convert a negative input signal into a positive input signal. Thus, the comparator 82 will have a voltage level on the Set output terminal that is positive with respect to the voltage level appearing on the Reset output terminal when the analog input signal is positive and will have a voltage on its Set output terminal that is negative with respect to the voltage on its Reset output terminal when the analog input signal is negative.

The timing pulse that interrogates the comparator 32 also sets the subsequent control flip-flop 84 to the Set state. When the flip-flop 84 is set, the Reset output terminal is down or at a negative level with respect to the Set output terminal and the digital to analog converter 22 subtracts half full scale current from the analog input signal appearing at the summing junction 18. Note that the polarity of the current supplied under the control of the flip-flop 84 is of a polarity opposite to that supplied under control of the flip-flop 82. If the signal appearing on the lead 26 is positive, indicating that the analog input signal is greater than the half full-scale current supplied on the lead 20 from the digital to analog converter 22, this positive signal will be inverted by the amplifier 24 and will be supplied to the comparator 34 via lead 28 as a negative input signal to input terminal A of the comparator. Since the input signal at the terminal A is negative with respect to the reference signal applied to terminal B, no output signal will appear on the terminal D and accordingly the control flip-flop 84 will remain in the Set condition, thus indicating that the analog input signal is equal to or greater than half full-scale. At the same time that the comparator 34 is being interrogated by the timing pulse $T_3$ appearing on the lead 73*c*, the control flip-flop 86 is being set by the same timing pulse. If the analog input signal is less than half full-scale current, the error signal appearing on the lead 26 will be negative and will appear as a positive signal at input terminal A of the comparator 34 after inversion by the amplifier 24. This positive input signal will cause an output pulse to appear on the output terminal D of the comparator 34 thereby returning the control flip-flop 84 to its reset state; in this state, the digital to analog converter 22 does not subtract half full-scale current from the summing junction 18. Thus, when the control flip-flop 84 is reset, the analog input signal is less than half full-scale current.

The sequence of operations for the setting of the control flip-flop 86 is similar to that described for the flip-flop 84 and will therefore not be further described in detail. The flip-flop 86 controls the subtraction of one quarter full-scale current from the analog input signal and the logical operations controlling it are similar to those described for the flip-flop 84.

The next two bits of the digital number are determined simultaneously by means of the comparators 38, 40 and 42. The control flip-flop 88 is in the Set condition due to the timing pulse which has been applied at the time $T_4$. The flip-flop 88 controls the subtraction of one eighth full-scale current from the summing junction 18, while the flip-flop 90 controls the subtraction of one sixteenth full-scale current from the summing junction. The decoding matrix 62 associated with the comparators 40 and 42 gates the output pulses from the output terminal C of these comparators to the Set terminal of the flip-flop 90.

Immediately prior to the time $T_5$, the error signal appearing on the lead 26 would be between 0 and one quarter full-scale current if the flip-flop 90 had not been Set to cause one-eighth full-scale current to be subtracted from the summing junction. With the flip-flop 90 in the Set state, the error signal on the lead 26 will lie between the range of —one-eighth full-scale current to +one-eighth full-scale current. If the error signal is positive at this point, it will be seen that insufficient current has been subtracted from it; accordingly, the flip-flop 88 should remain Set and one of the comparators 40 and 42 should be interrogated to determine whether or not one sixteenth full-scale current should be subtracted from the error signal. Conversely, if the error signal on the lead 26 is negative just prior to $T_5$, the flip-flop 88 should be reset (thereby adding one sixteenth full-scale current back into the summing junction) and the comparators 40 and 42 should be interrogated to determine whether or not one sixteenth full-scale current should be subtracted. This logical decision is implemented by the comparator sub-unit consisting of the comparators 38, 40 and 42, the decoding matrix 62 containing the OR gate 64, and the control flip-flop 90.

When the signal on the lead 26 is positive, indicating that insufficient current has been subtracted from the summing junction, the flip-flop 88 remains in the Set condition after the comparator 38 is interrogated at time $T_5$, since the error signal applied to terminal A of the comparator is negative with respect to ground. The comparator 42 is also interrogated at time $T_5$, the error signal applied to the terminal A of this comparator being translated upwards by the reference voltage $+E_1$ applied to the voltage divider consisting of the resistors 43 and 45. The voltage $E_1$ applied to the comparator 40 is chosen to correspond to the magnitude of the current increment associated with the flip-flop which the comparator controls; since the comparator 40 is associated with the control flip-flop 90 which determines whether or not one sixteenth full-scale current will be subtracted from the current junction, the voltage $E_1$ is chosen to correspond to one sixteenth full-scale current. Accordingly, if the error signal on the lead 28 is still negative after being translated upward by one sixteenth full-scale current, an output pulse is supplied on the output terminal C of the comparator 40, thereby setting the control flip-flop 90 through the OR gate 64 to subtract an additional one sixteenth unit of full-scale current from the summing junction 18.

When the signal on the lead 26 is negative, indicating that excessive current has been subtracted from the summing junction, the error signal on lead 28 will be positive, thereby causing the comparator 38 to supply an output pulse at output terminal D to reset the flip-flop 88. This output pulse is also coupled to the Enable input terminal E of the comparator 40. The error signal on the lead 28 is translated downward, by means of the voltage $-E_1$ and the potential divider consisting of the resistors 39 and 41, before being applied to the input terminal A of the comparator 40. If the translated signal is negative, an output pulse is applied to the output terminal C to set the control flip-flop 90 through the OR gate 64 thereby causing the analog to digital converter 22 to subtract one sixteenth full-scale current from the summing junction 18. Thus, bits 16 and 8 of the digital number are determined simultaneously at the time $T_5$.

It will be noted that, due to the interconnection of the Enable input terminal of the comparator 38 and the output terminal C of the comparator 40 and the provision of positive and negative offset voltages having a magnitude corresponding to the current level being determined, I have provided a novel comparator circuit for the simultaneous determination of a pair of digital bits. In contrast to other parallel or simultaneous conversion techniques which require a rather elaborate decoding matrix to obtain a useful output signal, my comparator circuit requires but a single OR gate associated with the control flip-flop of one of the bits being converted. This becomes an especially significant factor in high-speed pulse systems such as the analog to digital converter disclosed herein in which the elimination of a single AND gate in the decoding matrix associated with the converter can add measurably to the performance and cost characteristics of the system.

The remaining bits of the digital word, namely, the 4, 2, and 1 bits, are determined by the technique of parallel-threshold decoding by means of the converters 46–58. The reference voltage $+E_2$ which is applied to the voltage divider consisting of the resistors 53*a*–53*h* applies successively increasing bias levels to the comparator chain extending from the comparator 44 to the comparator 58. In effect, the error signal appearing on the lead 28 is translated upwardly by varying amounts before being applied to the respective comparators. The comparator output appears in the form of a voltage level on the output terminal C′, the voltage on this terminal being "up" or more positive when the input terminal A′ is negative with respect to the terminal B′. The output signals from the comparators are applied to the decoding matrix 60 which may consist of any of the well known decoding matrices for parallel threshold converters. An additional comparator 44 is utilized to provide an overload indication when the error signal applied to the converters 46–58, after the previous high-order bits have been determined, is greater than the capacity of the converter.

The digital output signal from the decoding matrix 60 is passed to the transfer gates 92 at the time $T_6$. This signal, together with the digital signals from the output terminals of the control flip-flops 82–90, is passed by the transfer gates 92 at the time $T_6$ and is then available on the output terminals 94*a*–94*i*.

It will be noted that the last three bits of the digital number corresponding to the analog input signal are passed to the transfer gates 92 directly from the decoding matrix 60 whereas the two higher-order bits which have also been simultaneously determined are passed to the transfer gates 92 only by way of the control flip-flops 88 and 92. Thus, the comparators 32–42 are included within the feedback loop which includes the control flip-flops 80, the digital to analog converter 22, the summing junction 18, and the inverter amplifier 24, while the comparators 44–58 lie outside of this loop. This technique of simultaneous determination of two or more of the high-order bits within a feedback loop combines, to the fullest extent, the inherent accuracy of the feedback type of converters with the speed of the simultaneous type of converter. By thus providing an analog to digital converter which performs both sequential and simultaneous conversions on the high order bits within the feedback loop and which performs a simultaneous conversion on the low order bits outside the feedback loop, I have been able to achieve conversion times of slightly less than one microsecond for an eight bit conversion.

It will be apparent to those skilled in the art that various modifications may be made in my invention to suit the needs of the designer or user. Thus, several simultaneous conversions may be performed within the feedback loop on the higher order bits, the remaining or low order bits being converted outside the loop. Several groups or clusters of comparators similar to those shown at 38, 40, and 42, may be utilized within the loop to perform a sequence of parallel conversions, two bits at a time. Alternatively, one or more groups of simultaneous converters capable of converting two or more bits at a time may be enclosed. Within the feedback loop, either with or without additional sequential converters in the loop, the lower-order bits being determined by either a simultaneous or a sequential method It will thus be seen that the objects set forth above, among those made apparent from the preceding description, are efficiently attained and, since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described my invention, what I claim as new and desire to secure by Letters Patent is:

1. A high speed analog to digital converter for converting an analog signal to a digital signal expressed as a plurality of binary bits, comprising in combination a first analog to digital converter section of the sequential feedback type for determining the value of the most significant bits represented by said signal, said first converted section including a summing junction, to which the analog signal to be converted and a signal representing the count in said first converter section are supplied as input signals at least one additional converter section of the simultaneous type for determining the least significant bits represented by said signal, the input signal to said simultaneous converter being the output signal from said summing junction, the output signal from both said converter sections being supplied following completion of conversion by said first converter section.

2. A high speed analog to digital converter for converting an analog signal to a digital signal expressed as a plurality of binary bits comprising, in combination a first analog to digital converter section of the sequential feedback type for determining the value of the most significant bits represented by said signal, a second converter section of the simultaneous type for determining the next most siginificant bits after said first section has completed its conversion, said first and second converter sections being included within a feedback loop including a digital to analog converter and a summing junction, and a third converter section of the simultaneous type outside said feedback loop for determining the least significant bits of said output signal, the output signal from said summing junction being supplied as an input signal to all of said converter sections.

3. The combination defined in claim 2 in which said first converter section includes a number of comparators equal to the number of bits said first section is to convert, each of said comparators being used in turn to convert a single bit.

4. A high speed analog to digital converter for converting an analog signal to a digital signal expressed as a plurality of bits, comprising, in combination, a first converter section of the sequential conversion type having a comparator for each bit to be determined, a second converter section of the simultaneous conversion type, a digital to analog converter, means connecting said first and second converter sections to said digital to analog converter whereby an analog output signal proportional to the digital output signal from said converter sections is generated by said digital to analog converter, a summing junction, means connecting the analog input signal to be converted as a first input signal to said summing junction, means connecting the analog signal from the digital to analog converter as a second input signal to the summing junction, a third converter section, means including an amplifier connecting the output signal from said summing junction as an input signal to each of said converter sections, and means for controlling the operation of said converter sections whereby said first and second converter sections complete their respective conversion in sequence before the digital output signal from said converter is made available.

5. The combination defined in claim 4 in which the means connecting the first and second converter sections to the digital to analog converter includes at least one flip-flop for each digital bit generated by said sections, the digital signal applied to the digital to analog converter being supplied from the output terminals of said flip-flops.

6. The combination defined in claim 5 in which the first converter section is of the sequential type having at least one comparator for each bit to be determined, and in which the second converter section is of the simultaneous type having a greater number of comparators than the number of bits to be determined by said section, said control means being operative to cause said second converter section to perform a conversion after the first converter section has completed a conversion of the digital bits associated with said converter section.

7. A simultaneous converter circuit for converting an analog input signal into a digital output signal having two binary bits, said converter comprising, in combination, first, second, and third comparators, each of said comparators having a pair of input terminals, a pair of output terminals, and a control terminal for energizing the comparator upon receipt of a control signal, the analog input signal being applied to one terminal of each said pairs of input terminals, a reference signal being applied to the other terminal of each of said pairs of input terminals, an output signal being applied by the respective comparator to one or the other output terminal of each of said pairs of output terminals when a control signal is applied to said control terminal, the selection of the terminal on which the output signal is to appear being dependent on whether the analog input signal applied to the comparators is greater than or less than the reference signal, means interconnecting the control terminals of said first and third comparators, means for providing a bias of opposite polarity to the second and third comparators to thereby translate the voltage level of the analog input signal before application to the respective comparators, and means connecting the control terminal of the second comparator to one of the output terminals of the first comparator, whereby a digital output signal propotrional to the analog input signal is obtained from the converter circuit.

References Cited

UNITED STATES PATENTS

| | | | |
|---|---|---|---|
| 2,775,754 | 12/1956 | Sink | 340—347 |
| 3,072,332 | 1/1963 | Margopoulos | 340—347 |
| 3,087,150 | 4/1963 | James | 340—347 |
| 3,241,135 | 3/1966 | Kuflik | 340—347 |
| 3,255,447 | 6/1966 | Sharples | 240—347 |
| 3,267,459 | 8/1966 | Chomicki | 340—347 |
| 3,277,463 | 10/1966 | Rosenberg | 340—347 |
| 3,311,910 | 3/1967 | Doyle | 340—347 |

MAYNARD R. WILBUR, *Primary Examiner.*

DARYL W. COOK, *Examiner.*

W. J. KOPACZ, *Assistant Examiner.*